US007619946B2

(12) United States Patent
Byeon et al.

(10) Patent No.: US 7,619,946 B2
(45) Date of Patent: Nov. 17, 2009

(54) ACTIVE DRIVER FOR USE IN SEMICONDUCTOR DEVICE

(75) Inventors: Sang-Jin Byeon, Kyoungki-do (KR); Seok-Cheol Yoon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 183 days.

(21) Appl. No.: 11/823,695

(22) Filed: Jun. 28, 2007

(65) Prior Publication Data

US 2008/0012629 A1 Jan. 17, 2008

(30) Foreign Application Priority Data

Jun. 29, 2006 (KR) ...................... 10-2006-0059857

(51) Int. Cl.
*G11C 7/00* (2006.01)

(52) U.S. Cl. ....................... 365/226; 365/201; 365/194; 365/189.08

(58) Field of Classification Search ................. 365/226, 365/201, 194, 189.08
See application file for complete search history.

(56) References Cited

U.S. PATENT DOCUMENTS

| | | | | |
|---|---|---|---|---|
| 5,349,559 | A * | 9/1994 | Park et al. | 365/201 |
| 5,452,253 | A * | 9/1995 | Choi | 365/201 |
| 6,150,860 | A | 11/2000 | Chun | |
| 6,339,357 | B1 * | 1/2002 | Yamasaki et al. | 327/538 |
| 6,522,193 | B2 | 2/2003 | Shin | |
| 6,958,947 | B2 | 10/2005 | Park et al. | |
| 7,046,074 | B2 | 5/2006 | Jang | |
| 2004/0155701 | A1 | 8/2004 | Kim et al. | |
| 2006/0140020 | A1 | 6/2006 | Do | |

FOREIGN PATENT DOCUMENTS

| | | | |
|---|---|---|---|
| JP | 6-0349298 | | 12/1994 |
| JP | 2003-30985 | A | 1/2003 |
| JP | 2005-318034 | A | 11/2005 |
| KR | 2000- 0065603 | | 11/2000 |
| KR | 2002-0080089 | | 10/2002 |
| KR | 10-2004-0011835 | | 2/2004 |
| KR | 10-2005-0079538 | | 8/2005 |
| KR | 10-2006-0008145 | | 1/2006 |

* cited by examiner

*Primary Examiner*—Don Finh
(74) *Attorney, Agent, or Firm*—Blakely Sokoloff Taylor & Zafman

(57) ABSTRACT

An active driver includes an internal voltage supply node, an internal voltage generator, and a test internal voltage driving circuit. The internal voltage generator generates an internal voltage having a first potential level in a normal operation to provide the internal voltage to the internal voltage supply node. The test internal voltage driving circuit drives an external voltage having a second potential level higher than the first potential level to the internal voltage supply node in a test operation.

10 Claims, 6 Drawing Sheets

30

ACTIVE DRIVER FOR USE IN SEMICONDUCTOR DEVICE

CROSS-REFERENCE TO RELATED APPLICATION

The present invention claims priority of Korean patent application number 10-2006-0059857, filed on Jun. 29, 2006, which is incorporated by reference in its entirety.

BACKGROUND OF THE INVENTION

The present invention relates to an active driver for generating an internal voltage; and, more particularly, to an active driver for generating an internal voltage having a stable potential level during a test operation.

In dynamic random access memory (DRAM), peripheral circuits, memory arrays and the like taking an internal voltage have a difficulty in doing a stable operation due to serious load variations for each operation mode. Because of this, in case of core voltage VCORE used for operating cells, a sub word line driver, a sense amplifier, an X-decoder and a Y-decoder in DRAM, a standby driver or an active driver is selectively used depending on an operation mode.

FIG. 1 is a block diagram showing a conventional device for generating a core voltage VCORE.

Referring to FIG. 1, the conventional device for generating a core voltage VCORE is provided with a reference voltage VREF generator 10 for taking an external voltage VDD and a ground voltage VSS and generating a reference voltage VREF, a core voltage VCORE standby driver 20 that operates when a memory is in a precharge state and generates a core voltage VCORE based on the reference voltage VREF, and a core voltage VCORE active driver 30 that operates when the memory is in an active state and produces the core voltage VCORE from the reference voltage VREF.

More specifically, the core voltage active driver 30 operates in response to an active signal ACT.

Here, an activation operation of the active signal ACT means a sensing operation being conducted under a state that a word line of DRAM has been enabled. This implies that much current is consumed in a sense amplifier by the sensing operation. That is, since the potential level of the core voltage VCORE can drop, the core voltage active driver 30 using a transistor with large capacity should be operated.

Similarly, the core voltage standby driver 20 operates in response to a precharge signal PRECHARGE.

Here, an activation operation of the precharge signal PRECHARGE means a precharge operation of DRAM, which does not use much current. Thus, the core voltage standby driver 20 using a transistor with small capacity should be utilized to prevent unnecessary current consumption.

FIG. 2 is a detailed circuit diagram of the core voltage active driver 30 shown in FIG. 1.

Referring to FIG. 2, the core voltage active driver 30 is provided with a comparator that generates the core voltage VCORE when the active signal ACT is activated to a logic high level and the reference voltage VREF is inputted.

That is, when the active signal ACT is activated to a logic high level, PMOS transistors P2, P5 and P7 are turned off and NMOS transistors N3 and N7 are turned on and thus the core voltage active driver 30 starts to operate.

When the core voltage active driver 30 starts to operate, it operates in two types of states depending on a potential level of a half core voltage HALF_VCORE.

Here, the half core voltage HALF_VCORE denotes a voltage that is obtained by dividing the core voltage VCORE outputted from the cover voltage active driver 30 with resistance values of resistive elements PD1 and PD2. If the elements PD1 and PD2 have the same resistance value, they have a potential level that is derived by dividing the potential level of the core voltage VCORE by 2.

The following is a description for a case where the core voltage active driver 30 is in an initial state and the potential level of the half core voltage HALF_VCORE is lower than a potential level of the reference voltage VREF. Of course, it is assumed that the potential level of the half core voltage HALF_VCORE is higher than a threshold voltage Vt of an NMOS transistor N4. In addition, it is further assumed that N2 and N4 that are two input ends of the comparator and NMOS transistors are the same sized-transistors.

Since the potential level of the half core voltage HALF_VCORE is lower than the potential level of the reference voltage VREF, the gate-source voltage VGS of the NMOS transistor N2 has a potential level higher than that of the NMOS transistor N4. That is, the voltage drop arising at a node L is larger than that at a node R. The voltage drop at the node L causes the PMOS transistor P1 to be turned on and the external voltage VDD supplied through the PMOS transistor P1 causes the NMOS transistor N5 to be turned on. Likewise, the voltage drop at the node R causes the PMOS transistor P6 to be turned on, but it is turned on less than the NMOS transistor N5 turned on by the voltage drop at the node L. Therefore, the charge supply capability of the PMOS transistor P6 is smaller than that of the NMOS transistor N5.

A driving node DRV becomes a logic low level due to the operation set forth above, and thus, a PMOS transistor P8 is turned on to elevate the potential level of the core voltage VCORE. The core voltage VCORE with potential level being so elevated is continuously kept until the potential level of the half core voltage HALF_VCORE becomes higher than that of the reference voltage VREF.

The following is a description for a case where the potential level of the half core voltage HALF_VCORE is higher than that of the reference voltage VREF.

Since the potential level of the half core voltage HALF_VCORE is higher than that of the reference voltage VREF, the gate-source voltage VGS of the NMOS transistor N2 has a potential level lower than that of the NMOS transistor N4. That is, the voltage drop arising at the node L is less than that at the node R. The voltage drop at the node R causes the PMOS transistor P6 to be turned on. Similarly, the voltage drop at the node L causes the PMOS transistor P1 to be turned on and the external voltage VDD supplied through the PMOS transistor P1 causes the NMOS transistor N5 to be turned on, but it is turned on less than the PMOS transistor P6 turned on by the voltage drop at the node R. Therefore, the charge supply capability of the NMOS transistor N5 is smaller than that of the PMOS transistor P6.

The driving node DRV becomes a logic high level due to the operation described above, and thus, the PMOS transistor P8 is turned off, which does not supply the external voltage VDD to the output end of the core voltage active driver 30. The operation set forth above is continued until the potential level of the half core voltage HALF_VCORE becomes lower than that of the reference voltage VREF.

In the prior art, the sole difference between the core voltage standby driver 20 and the core voltage active driver 30 is that the sizes of transistors used therein are different from each other. Therefore, the operation of the core voltage standby driver 20 is the same as that of the core voltage active driver 30 mentioned above.

In case DRAM operates in normal mode, the core voltage VCORE can be maximally consumed in the following case.

Under the circumstance that the word lines of all memory banks are active, plural bit lines are enabled at time intervals of tCCD (column address to column address delay) in an alternate manner for each memory bank, followed by write operation.

In other words, it is designed in a manner that the driving capability of the core voltage active driver 30 is based on the circumstances set forth above.

However, in the process of manufacturing DRAM, since test time of DRAM highly affects its cost, it is being progressed in direction of minimizing the test time.

That is, if DRAM operates in test mode, the core voltage VCORE is maximally consumed in the following case. Specifically, much more core voltage VCORE is consumed compared with the case of being most consumed if DRAM operates in normal mode.

If DRAM operates in test mode, under the circumstance that the word lines of all memory banks are active, plural bit lines are enabled at time intervals of tCCD in an alternate manner for each memory bank, followed by write operation.

In this case, the driving capability of the conventional core voltage active driver 30 is limited to supplying the core voltage VCORE required for test operation.

As such, if the amount of consumption of the core voltage VCORE is greater than the driving capability of the core voltage active driver 30, there occurs a case where the potential level of the core voltage VCORE is not constantly maintained, which may cause a malfunctioning of memory device.

Further, the reliability of test operation of DRAM much lower, thereby increasing manufacturing cost.

SUMMARY OF THE INVENTION

Embodiments of the present invention are directed to provide an active driver for generating an internal voltage having a reliable voltage level during a test operation.

In accordance with an aspect of the present invention, there is provided an active driver including an internal voltage supply node, an internal voltage generator, and a test internal voltage driving circuit. The internal voltage generator generates an internal voltage having a first potential level in a normal operation to provide the internal voltage to the internal voltage supply node. The test internal voltage driving circuit drives an external voltage having a second potential level higher than the first potential level to the internal voltage supply node in a test operation.

DESCRIPTION OF SPECIFIC EMBODIMENTS

Hereinafter, preferred embodiments of the present invention will be described in detail with reference to the accompanying drawings. But, the invention is not limited to these embodiments set forth below and may be configured in various types, and the embodiments are provided for disclosure purpose of the invention only and to fully provide the scope of the invention to those skilled in the art.

Figure 3:
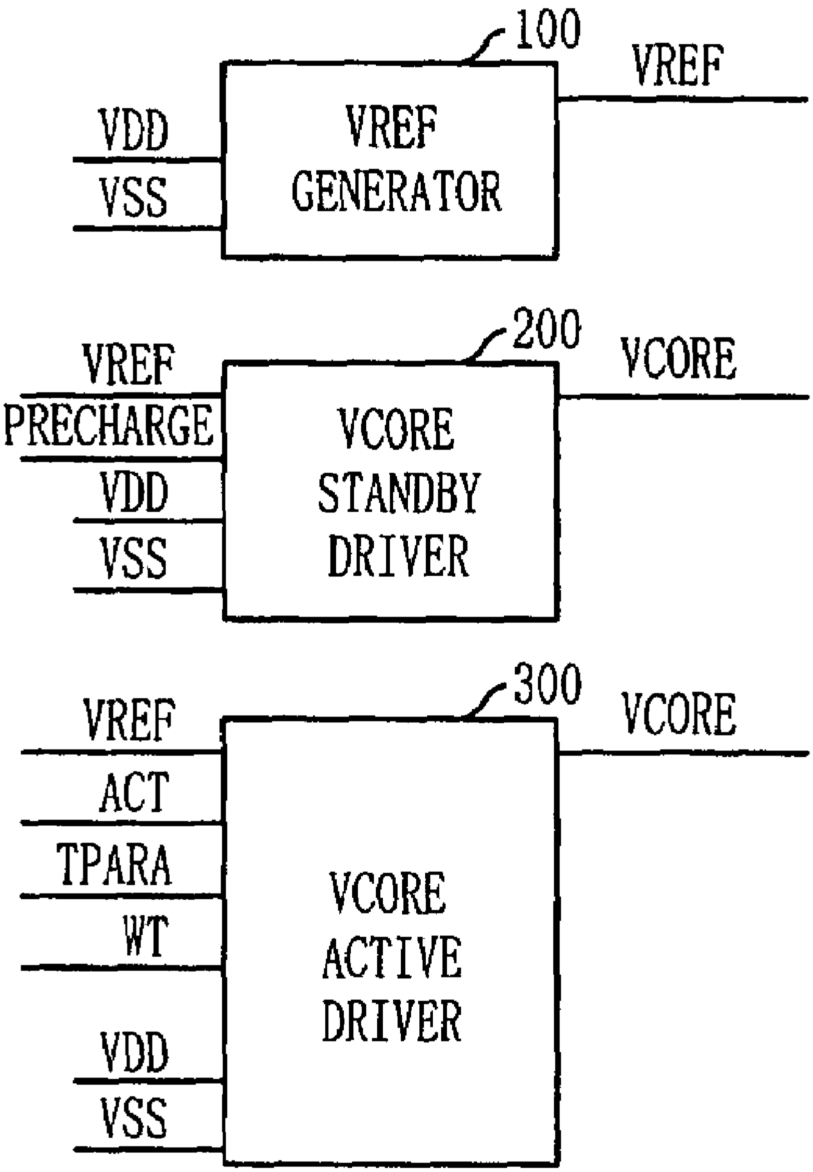
FIG. 3 is a block diagram illustrating a device for generating a core voltage VCORE in accordance with a preferred embodiment of the present invention.

FIG. 3 is a block diagram illustrating a device for generating a core voltage VCORE in accordance with a preferred embodiment of the present invention.

Figure 1:
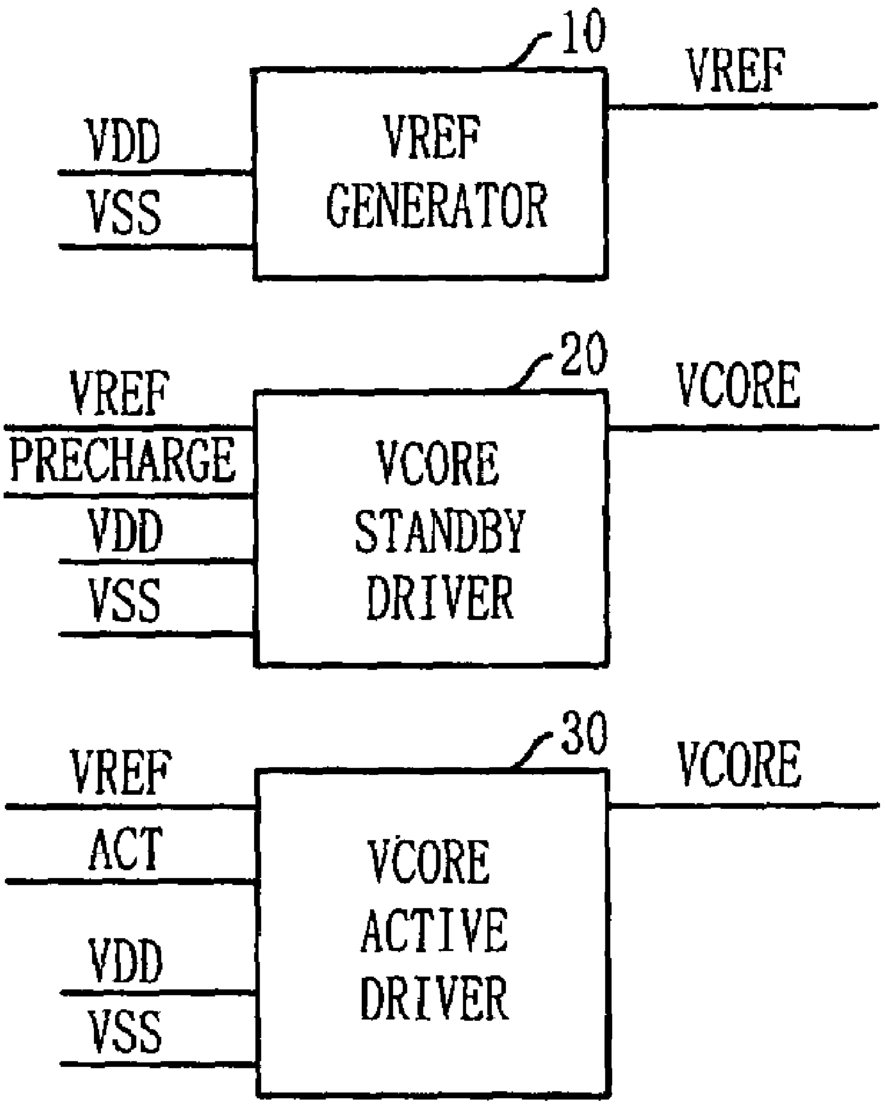
FIG. 1 is a block diagram showing a conventional device for generating a core voltage VCORE.

Referring to FIG. 3, there are the sameness and differences between the core voltage generating device of the invention and the conventional core voltage generating device shown in FIG. 1 as follows.

First, regarding a reference voltage (VREF) generator 100 that takes an external voltage VDD and a ground voltage VSS and generates a reference voltage VREF, the inventive core voltage generating device is the same as the conventional core voltage generating device.

Further, as for a core voltage (VCORE) standby driver 200 that generates a core voltage VCORE based on the reference voltage VREF but operates when a memory is in a precharge state, the inventive core voltage generating device is also the same as the conventional core voltage generating device.

Figure 2:
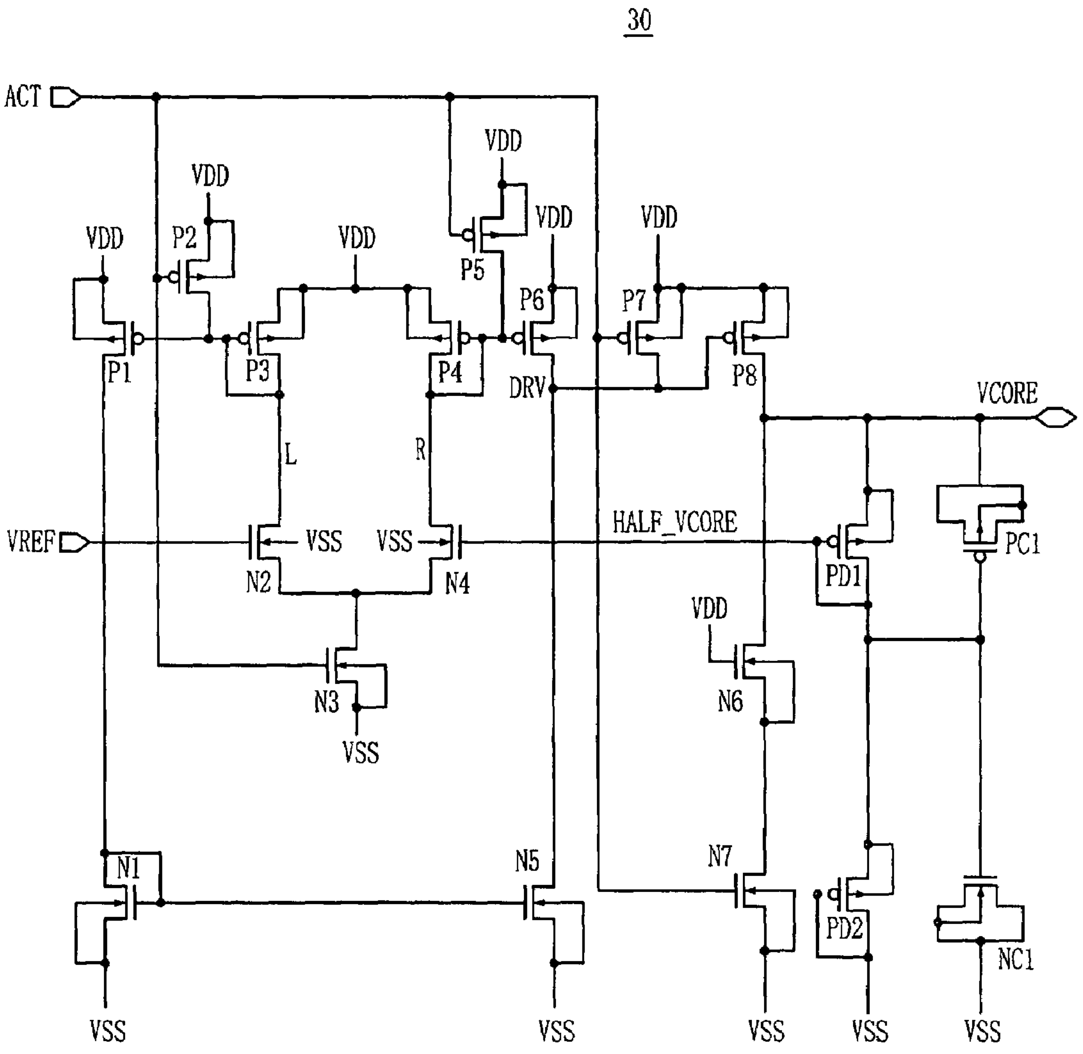
FIG. 2 is a detailed circuit diagram of the core voltage active driver shown in FIG. 1.

In addition, relating to a core voltage (VCORE) active driver 300 that generates the core voltage VCORE based on the reference voltage VREF but operates when the memory is in an active state, the inventive core voltage generating device in which a test enable signal TPARA notifying that the current operation is under a test operation and a test operation signal WT notifying the test operation (in FIG. 2, it is assumed that write operation is performed) are additionally provided is different from the conventional core voltage generating device.

Figure 4:
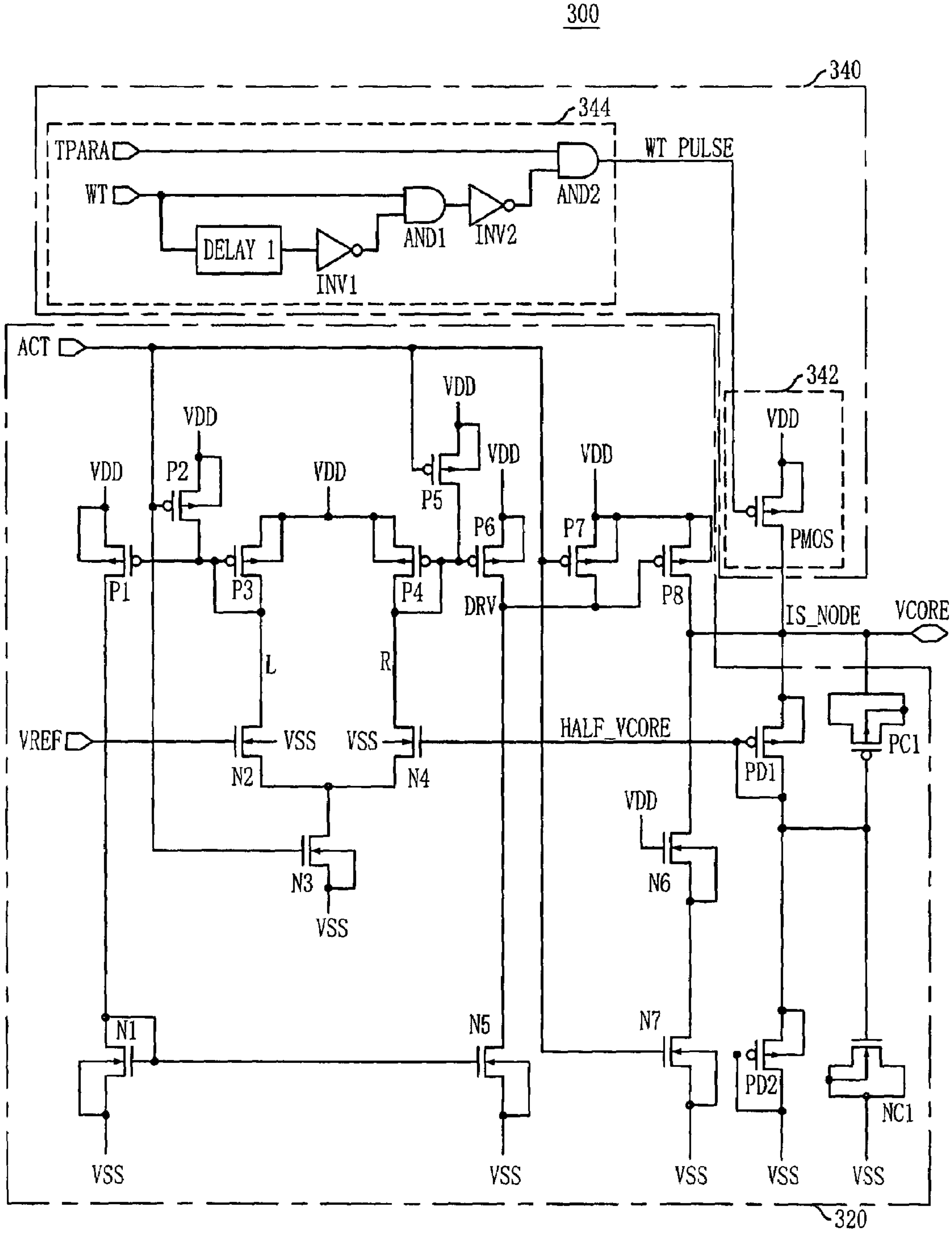
FIG. 4 is a detailed circuit diagram of one embodiment of the core voltage active driver shown in FIG. 3.

FIG. 4 is a detailed circuit diagram of one embodiment of the core voltage active driver 300 shown in FIG. 3.

Referring to FIG. 4, the core voltage active driver 300 of the invention is provided with a core voltage supply node IS_NODE, a core voltage generator 320 for generating a core voltage VCORE having a first potential level in a normal operation to provide the core voltage to the core voltage supply node IS_NODE, and a test core voltage driving circuit 340 for driving an external voltage VDD having a second potential level higher than the first potential level to the core voltage supply node IS_NODE in a test operation.

Here, the test internal voltage driving circuit 340 is composed of a driving element 342 connected to the core voltage supply node IS_NODE for driving the external voltage VDD, and a driving controller 344 for controlling the driving element 342 so that the external voltage VDD is being driven at a desired test operation interval which is a write operation executed by the test operation signal WT.

Among the components of the test core voltage driving circuit 340, the driving element 342 is composed of a PMOS transistor PMOS that controls the connection between the external voltage VDD and the core voltage supply node IS_NODE coupled to its source-drain path in response to an output signal WT PULSE of the driving controller received via a gate.

Further, among the components of the test core voltage driving circuit 340, the driving controller 344 controls the driving element 342 by toggling the output signal WT PULSE of the driving controller by a desired amount of time at a test operation interval at which the test enable signal TPARA and the test operation signal WT are activated.

In addition, among the components of the test core voltage driving circuit 340, the driving controller 344 is composed of a first delay element DELAY 1 for delaying the test operation signal WT by a desired amount of time, a first inverter INV1 for inverting and outputting an output signal of the first delay element DELAY 1, a first AND gate AND1 for taking the test operation signal WT as a first input and an output signal of the first inverter INV1 as a second input and AND-operating them, a second inverter INV2 for inverting and outputting an output signal of the first AND gate AND1, and a second AND gate AND2 for taking the test enable signal TPARA as a first input and an output signal of the second inverter INV2 as a second input and AND-operating them to provide an AND-operated result as the output signal WT PULSE of the driving controller.

The driving controller 344 described above activates the driving element 342 by a desired amount of time at the moment the test operation is carried out. That is, the output signal WT PULSE of the driving controller is activated from activation of the test operation signal WT to a logic high level to the desired amount of time.

Here, the desired amount of time may be varied by a designer, depending on the type of test operation that desires application of the technique of the invention out of a plurality of test operations.

Figure 5:
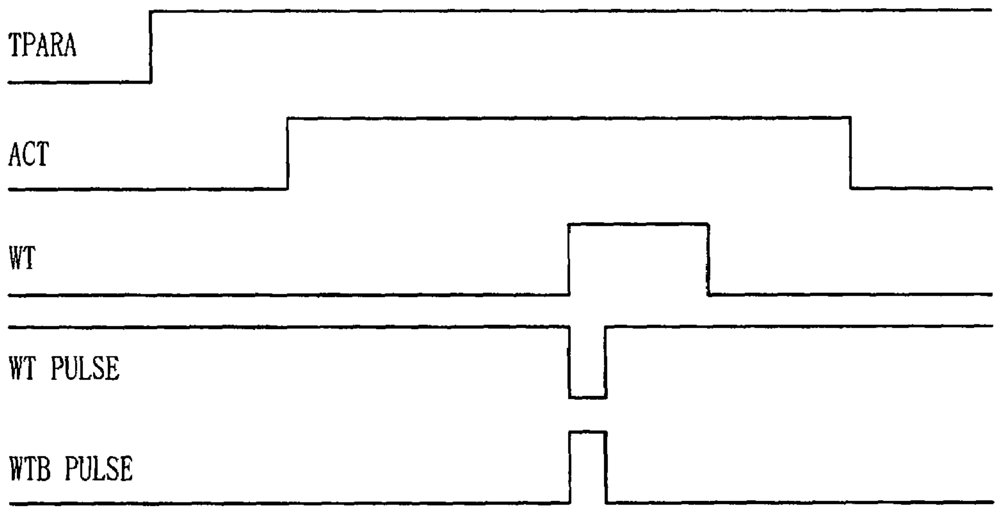
FIG. 5 is a timing diagram showing that the logic level of an input/output signal is varied by the driving controller shown in FIG. 4.

FIG. 5 is a timing diagram showing that the logic level of the input/output signal is varied by the driving controller 344 shown in FIG. 4.

Referring to FIG. 5, first, when the test enable signal TPARA notifying that the current operation is in a test operation and the active signal ACT operating the active core voltage driver 300 are activated, it can be seen that, when the test operation signal WT is toggled, the output signal WT PULSE from the driving controller is activated from the time the test operation signal WT is activated to a logic high level for a desired amount of time.

Figure 6:
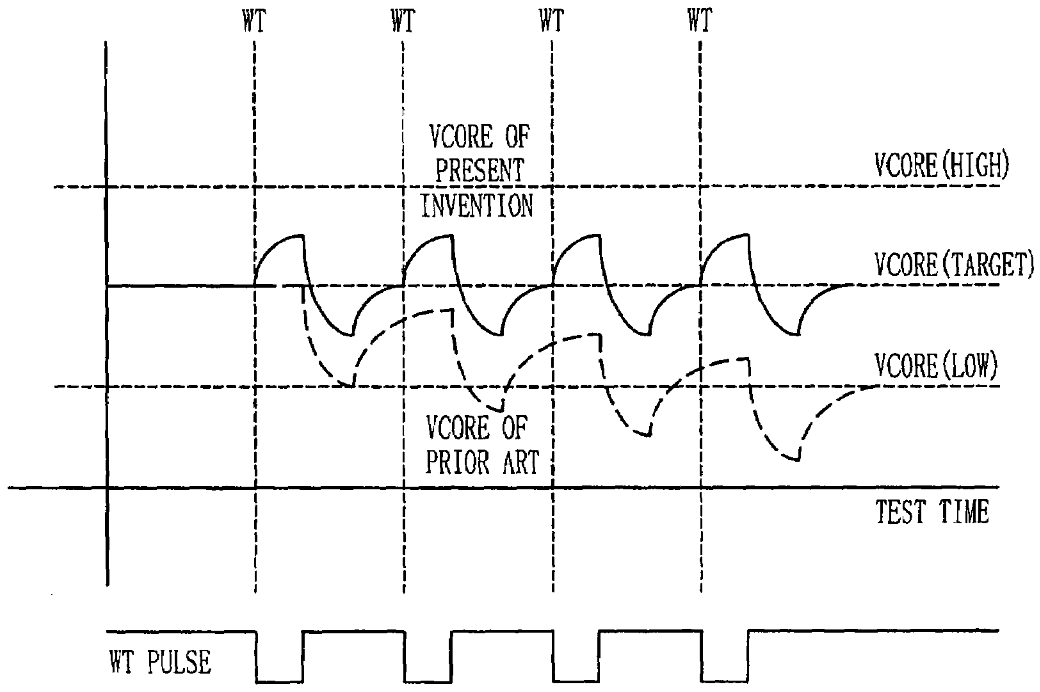
FIG. 6 is a graph comparing variations of the core voltage between the prior art and the embodiment of the invention.

FIG. 6 is a graph comparing variations of the core voltage between the prior art and the embodiment of the invention.

Referring to FIG. 6, as for the core voltage VCORE of the prior art, it can be seen that a decreased potential level whenever the test operation is performed by activation of the test operation signal WT is not recovered to an original potential level in the precharge operation. That is, it becomes a lower potential level with the passage of test time.

On the contrary, regarding the core voltage VCORE of the invention, it can be seen that, although its potential level is instantaneously decreased whenever the test operation is performed by activation of the test operation signal WT, the decreased potential level is recovered to the original potential level in the precharge operation. That is, the core voltage VCORE can be always maintained in a constant potential level even if the test time is extended.

Figure 7:
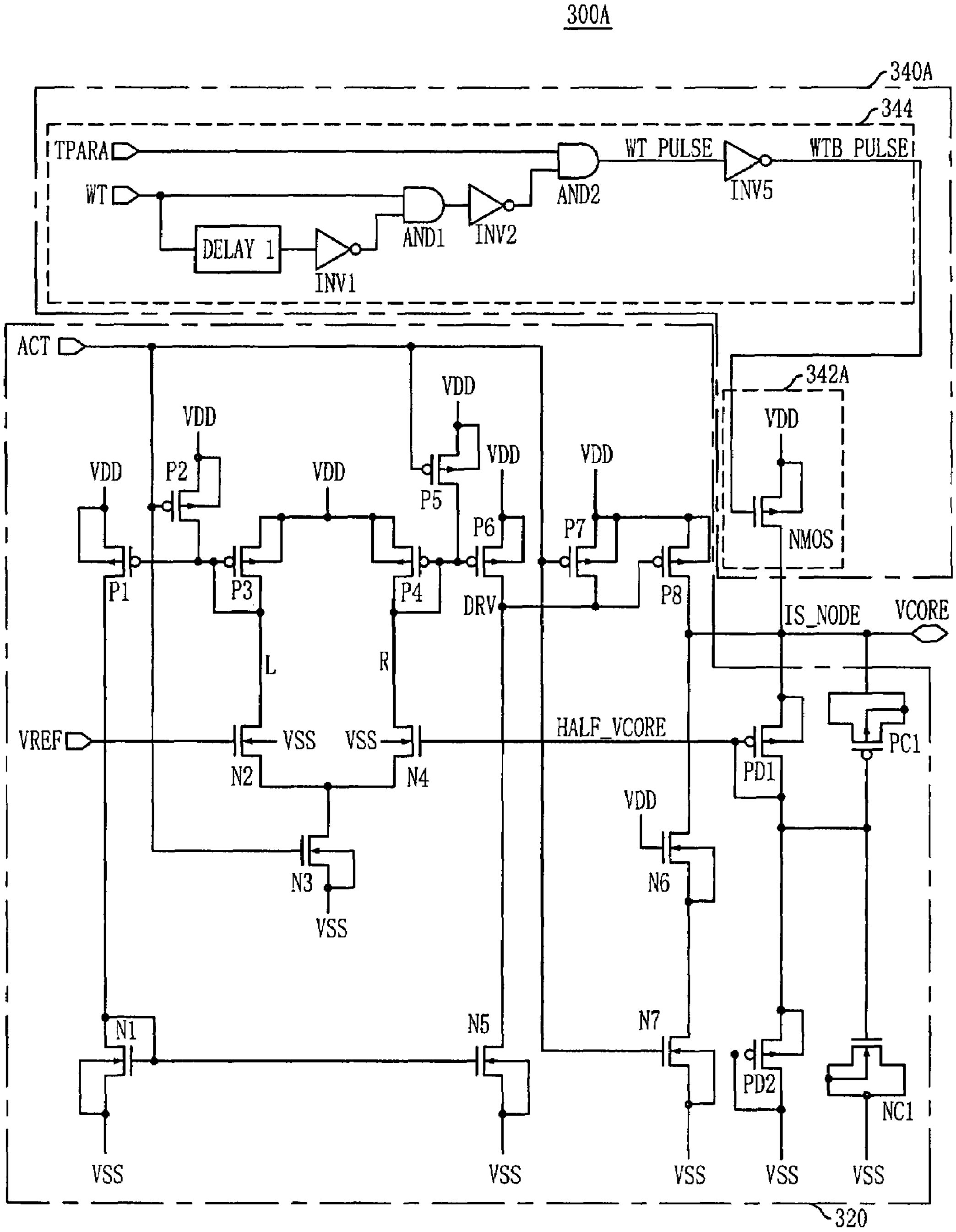
FIG. 7 is a detailed circuit diagram of another embodiment of the core voltage active driver shown in FIG. 3.

FIG. 7 is a detailed circuit diagram of another embodiment of the core voltage active driver 300 shown in FIG. 3.

Referring to FIG. 7, the detailed circuit of the core voltage active driver 300A in accordance with another embodiment of the invention is almost similar to that of the core voltage active driver 300 in accordance with one embodiment of the invention shown in FIG. 4, and therefore, only difference therebetween will be given below.

First, among the components of a test core voltage driving circuit 340A, a driving circuit 342A is provided with an NMOS transistor NMOS that controls the connection between the external voltage VDD and the internal voltage supply node IS_NODE coupled to its source-drain path in response to an output signal of the driving controller 344 being received via a gate. The difference is that one embodiment of the invention shown in FIG. 4 is provided with the PMOS transistor PMOS.

Second, among the components of the test core voltage driving circuit 340A, the driving controller 344 is further provided with an inverter INV5 at its output end in order to compensate the change from the PMOS transistor PMOS to the NMOS transistor NMOS in the driving circuit 342A.

Although one embodiment and another embodiment of the invention are described with respect to the generation of the core voltage VCORE as one example, the technique of the invention may also be used in generating a peri voltage Vperi instead of the core voltage VCORE.

Further, the technique of the invention may also be used in generating a delay locked loop power supply voltage VDLL instead of the core voltage VCORE.

The internal voltage generator 320 illustrated in one embodiment and another embodiment of the invention is substantially identical to that of the prior art and its operation is also described in the prior art section, and therefore, details thereon will be omitted here.

It should be noted that the logic gates and transistors illustrated in the aforementioned embodiments may be implemented in different types and arrangements based on the polarities of input signals.

As described above, with the embodiments of the invention, the internal voltage with stable potential level can also be generated even if the amount of current used by the test operation is increased, thereby improving reliability of the semiconductor device.

In addition, it can be expected that the present invention can increase yield of the semiconductor device in producing step.

While the present invention has been described with respect to the specific embodiments, it will be apparent to those skilled in the art that various changes and modifications may be made without departing from the spirit and scope of the invention as defined in the following claims.

what is claimed is:

1. An active driver, comprising:

an internal voltage supply node;

an internal voltage generator for generating an internal voltage having a first potential level in a normal operation to provide the internal voltage to the internal voltage supply node; and a test internal voltage driving circuit for driving an external voltage having a second potential level higher than the first potential level to the internal voltage supply node in a test operation, wherein the test internal voltage driving circuit includes:

a driving element connected to the internal voltage supply node for driving the external voltage; and a driving controller for controlling the driving element so that the external voltage is being driven at a desired test operation interval.

2. The active driver as recited in claim 1, wherein the driving element is provided with a PMOS transistor that controls the connection between the external voltage and the internal voltage supply node coupled to its source-drain path in response to an output signal of the driving controller being received via a gate.

3. The active driver as recited in claim 2, wherein the driving controller controls the driving element by toggling the output signal of the driving controller by a desired amount of time at a test operation interval at which a test enable signal and a test operation signal are activated.

4. The active driver as recited in claim 3, wherein the driving controller includes:

a first delay element for delaying the test operation signal by the desired amount of time;

a first inverter for inverting and outputting an output signal of the first delay element;

a first AND gate for taking the test operation signal as a first input and an output signal of the first inverter as a second input and AND-operating them;

a second inverter for inverting and outputting an output signal of the first AND gate; and a second AND gate for taking the test enable signal as a first input and an output signal of the second inverter as a second input and AND-operating them to provide an AND-operated result as the output signal of the driving controller.

5. The active driver as recited in claim 1, wherein the driving element is provided with an NMOS transistor that controls the connection between the external voltage and the internal voltage supply node coupled to its source-drain path in response to an output signal of the driving controller being received via a gate.

6. The active driver as recited in claim 5, wherein the driving controller controls the driving element by toggling the output signal of the driving controller by a desired amount of time at a test operation interval at which a test enable signal and a test operation signal are activated.

7. The active driver as recited in claim 6, wherein the driving controller includes:

a second delay element for delaying the test operation signal by the desired amount of time;

a third inverter for inverting and outputting an output signal of the second delay element;

a third AND gate for taking the test operation signal as a first input and an output signal of the third inverter as a second input and AND-operating them;

a fourth inverter for inverting and outputting an output signal of the third AND gate;

a fourth AND gate for taking the test enable signal as a first input and an output signal of the fourth inverter as a second input and AND-operating them; and a fifth inverter for inverting an output signal of the fourth AND gate to provide an inverted signal as the output signal of the driving controller.

8. The active driver as recited in claim 7, wherein the internal voltage is a core voltage and the test operation is a write test operation.

9. The active driver as recited in claim 7, wherein the internal voltage is a peri voltage.

10. The active driver as recited in claim 7, wherein the internal voltage is a delay locked loop power supply voltage.

* * * * *